United States Patent [19]

Kuhn et al.

[11] 3,970,872

[45] July 20, 1976

[54] CIRCUIT FOR GENERATING A TRIGGER BLANKING VOLTAGE FOR USE IN ANALYSIS OF THE IGNITION VOLTAGE WAVEFORM OF AN INTERNAL COMBUSTION ENGINE

[75] Inventors: Klaus Roland Kuhn; Viktor Stigler, both of Karlsruhe, Germany

[73] Assignee: Siemens Aktiengesellschaft, Munich, Germany

[22] Filed: June 27, 1974

[21] Appl. No.: 483,527

[30] Foreign Application Priority Data

July 12, 1973 Germany ............................ 2335562

[52] U.S. Cl. ................................. 307/265; 307/273

[51] Int. Cl.[2] .......................................... H03K 5/04

[58] Field of Search ............ 307/265, 273; 328/207, 328/58

[56] References Cited

UNITED STATES PATENTS 3,646,370 2/1972 Lowe ................................. 307/273

OTHER PUBLICATIONS

"Pulse Train Frequency Varied as Duty Cycle Stays Constant" by Ross, Electronics, July 21, 1969, p. 84.

"Duty Cycle Constant at any Trigger Frequency" by Klein in Electronics, July 26, 1965, pp. 62–63.

*Primary Examiner*—Stanley D. Miller, Jr.
*Attorney, Agent, or Firm*—Kenyon & Kenyon Reilly Carr & Chapin

[57] ABSTRACT

A circuit for generating a trigger blanking voltage for use in the analysis of the ignition voltage waveform of an internal combustion engine which includes a trigger controlled monostable multivibrator furnishing a speed dependent blanking pulse, the width of which is made a function of speed using a capacitor charging circuit coupled to the output of the monostable with feedback of the capacitor voltage to an external circuit determining the duration of the unstable state of the monostable.

3 Claims, 3 Drawing Figures

CIRCUIT FOR GENERATING A TRIGGER BLANKING VOLTAGE FOR USE IN ANALYSIS OF THE IGNITION VOLTAGE WAVEFORM OF AN INTERNAL COMBUSTION ENGINE

BACKGROUND OF THE INVENTION

This invention relates to the analysis of ignition voltage waveforms of internal combustion engines in general and more particularly to a circuit for generating a trigger blanking voltage useful in apparatus used to analyze such voltage waveforms.

The voltage waveform at the high voltage terminal of the ignition coil of an internal combustion engine provides important information for evaluating the ignition process. The ignition voltage waveform is characterised by the magnitude of the voltage present at certain points in time. Generally, analysis of the individual sections of the ignition voltage curve are initiated by a trigger signal taken therefrom. This generally corresponds to the high voltage present prior to breakdown in the spark plug. However, in some instances, during the course of ignition, the voltage curve exhibits a number of peaks which exceed the trigger threshold. As a result, after the initial triggering signal occurs, it is necessary to blank out further triggering signals which might occur during the course of ignition and which could reinitiate the measuring or analysis cycle. The required blanking interval is not necessarily a constant interval. In the ignition system of an internal combustion engine, the burning time of the ignition spark may be, for example, from 3.5 to 3.7 ms when idling. The burning time is normally followed by decay process lasting approximately 4 ms. The same engine at full load and high speed will have a spacing in time between two ignition processes of only 2.5 ms for example. In such a case, the duration of the burning line is shortened, due to insufficient charging of the ignition coil, to approximately 0.8 ms. At this high speed, the closing of the breaker contacts occurs during the delay cycle of the ignition coil. Thus, it becomes evident that trigger blanking must be made speed dependent.

In view of these requirements for a type of trigger blanking which is speed dependent, it is the object of the present invention to provide a circuit for generating a trigger blanking signal or pulse useful in the analysis of ignition voltage waveforms of an internal combustion engine, which trigger blanking voltage is of a duration which is speed dependent, becoming shorter with an increasing frequency of ignition pulses due to an increase in speed.

SUMMARY OF THE INVENTION

The present invention provides such a circuit by employing a monostable multi-vibrator for generating the blanking voltage. Connected to the output of the monostable is a capacitor charging circuit with the voltage carrying electrode of the capacitor therein coupled back to the RC circuit which determines the duration of the unstable state of the flipflop. Because of this feedback arrangement, the speed dependent frequency of the trigger blanking signal controls its duration.

As disclosed, the monostable multivibrator will preferably be an integrated circuit of the type having connections to which an external RC combination may be made for determining the duration of the unstable state of the monostable. In accordance with the preferred embodiment of the present invention, a fixed maximum duration of the blanking signal corresponding to an idling condition is obtained by generating a threshold voltage coupled to the output voltage of the capacitor charging circuit through a diode. Only when the output voltage of the capacitor charging circuit exceeds the threshold voltage will the speed dependent shorting of the blanking signal take place in this arrangement. The disclosed capacitor charging circuit comprises a switching transistor having its collector emitter path shunted by a capacitor through a diode and resistor connected in parallel. In addition, for purposes of protection, the capacitor is shunted by a Zener diode. The RC member which determines the duration of the unstable state of the flipflop is coupled to the output terminal of the capacitor charging circuit through another diode.

DETAILED DESCRIPTION OF THE PREFERRED EMBODIMENT

Figure 1:
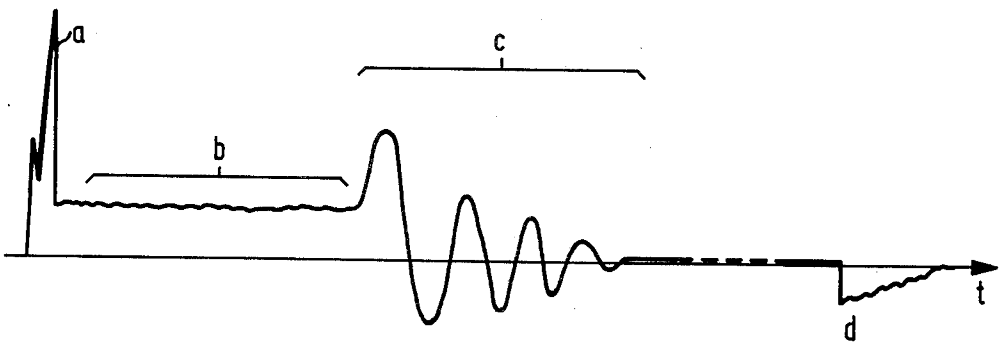
FIG. 1 illustrates the waveform of an ignition voltage curve with the internal combustion engine idling.

The voltage waveform of the ignition voltage with respect to time t for an internal combustion engine with spark ignition in the idling condition is shown on FIG. 1. The portion *a* of the waveform is what is referred to as the "base voltage line" and represents a voltage pulse which builds up in the ignition coil after the ignition current is interrupted by the breaker points. After the spark breakdown between the electrodes of the spark plug occurs, the voltage drops to the level of burning line which is indicated by *b*. The burning line *b* of the ignition voltage is followed by a decay portion *c*, during which the ignition voltage oscillates toward zero. The negative voltage step which follows thereafter results from the closing of the breaker points.

Figure 2:
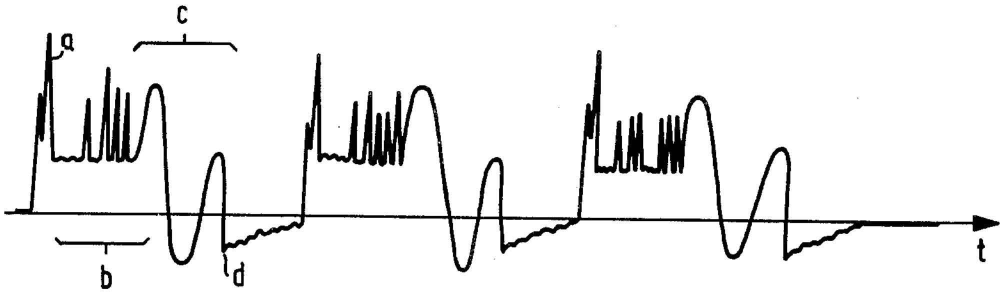
FIG. 2 illustrates a similar waveform on the same time scale for full load and high speed operation of the engine.

A corresponding ignition voltage waveform for high speed and full load operation of an engine under test is shown on FIG. 2 with the same time scale as FIG. 1. Significant differences between this waveform and that of FIG. 1 are apparent. The base voltage line has a lower amplitude and there is a considerable shortening of its length to approximately one-third or one-quarter of its duration during idling. In addition, it contains characteristic voltage peaks imposed on the burning voltage line, these peaks having an amplitude of the same order of magnitudes as the base voltage line. The decay portion *c* is shortened and the closing of the breaker points at *d* occurs within the decay period.

In order to analyze an ignition voltage waveform, the start of the ignition must be recognized. Generally, this is done by sensing the base voltage line, in particular its amplitude and steep decline. The base voltage line is thus used for triggering the entire measuring or analyzing arrangement. As is clear from FIG. 2, the voltage peaks appearing on the shortened burning line during full load operation, and which have essentially the same waveform as the base voltage line, can lead to a triggering of the measuring arrangement. As a result, if nothing further is done, triggering will be reinitiated each time one of these spikes is encountered. This prevents the proper measuring of the burning voltage. The present invention thus provides a trigger blanking voltage to prevent initiating of triggering after the initial triggering in response to the base voltage line.

Figure 3:
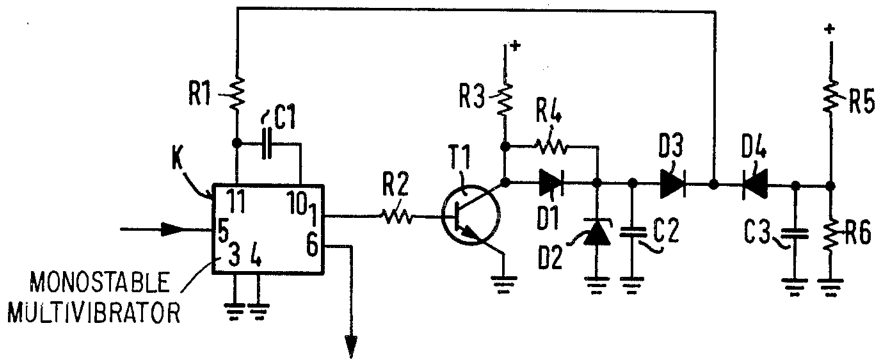
FIG. 3 is an embodiment of the circuit according to the present invention.

The preferred embodiment of a circuit for carrying out this generation of a speed dependent trigger blanking voltage is illustrated on FIG. 3. A commercially available monostable multivibrator K preferably an integrated circuit module such as an FLK 101 has its input terminal 5 provided with a normalized trigger pulse derived from the base voltage line. The trigger blanking signal is obtained from the non-inverted output terminal 6 of the multivibrator. In well known fashion, the duration of the blanking signal corresponding to the duration of the unstable state of the monostable multivibrator is determined in accordance with an RC combination comprising the resistor R1 and capacitor C1 coupled to the terminals 10 and 11 provided for that purpose. The duration of the blanking signal is also determined by the voltage applied to the other terminal of the resistor R1. It is through the control of this voltage that the circuit of the present invention causes the duration of the blanking signal to be proportional to the engine speed. The circuit has a capacitor charging circuit which includes a switching transistor T1, the base of which is coupled through a resistor R2 to the inverted output terminal of the monostable. In conventional fashion, this inverted output will be at a high or logic "1" state when the monostable is in its stable state and a a "0 " or ground level when the monostable is in its unstable state. Thus, when the monostable K is in its stable state, it provides a voltage turning the transistor T1 on. In other words, the transistor T1 is normally on and is only turned off during the occurrence of a blanking signal. When a blanking signal occurs and the transistor T1 is cut off, a capacitor C2 charges through a resistor R3 and diode D1. As illustrated, the capacitor C2 is connected in parallel with the emitter collector path of the transistor T1. This results in a charging of the capacitor C2 for the duration of the blanking pulse. At times other than the duration of the blanking signal, the transistor T1 is conducting and the capacitor C2 slowly discharges through it and the resistor R4. The resistor R4 is selected so that the rate of discharge corresponds to the greatest possible drop in engine speed. The capacitor C2 acts to average out the pulses provided to it so that its voltage represents a value proportional to the spacing of the trigger blanking pulses and thus also to the engine speed. At lower engine speeds where a lower frequency of blanking pulses occurs, i.e., greater pulse spacing, the voltage at the capacitor C2 is smaller and for higher speeds, becomes larger. A third capacitor C3 is provided which is maintained at a voltage determined by a voltage divider made up of the resistances R5 and R6. This voltage is provided through a diode D4 to the resistor R1. It is selected to have a value which will result in a blanking pulse output from the monostable K corresponding to the longest desired trigger blanking period, i.e., the trigger blanking time desired for the idling condition. At low speeds, such as idling, the voltage which builds up on the capacitor C2 will be less than the voltage at the capacitor C3. As a result, a diode D3 coupling the output voltage of capacitor C2 to resistor R1 will be back-biased and the voltage on resistor R1 will be determined by the capacitor C3. At higher speeds however, the voltage on capacitor C2, due to the increased frequency of the blanking pulses, will build up and will exceed the voltage on the capacitor C3. Now the diode D3 becomes forward-biased and the diode D4 back-biased. As a result, the voltage operating on the resistor R1 and determining the pulse duration is the voltage from the capacitor C2. The higher voltage causes shorter pulses in well known fashion. There is also provided in parallel with capacitor C2, a Zener diode D2 which is used for voltage limiting purposes and is selected to limit the voltage output of capacitor C2 at a level which will not cause damage to the integrated circuit K. It is evident that a disrete component monostable may be used rather than an integrated circuit.

Thus, an arrangement circuit for providing a trigger blanking pulse useful when analyzing the ignition voltage waveforms of an internal combustion engine has been shown. Although a specific embodiment has been illustrated and described, it will be obvious to those skilled in the art that various modifications may be made without departing from the spirit of the invention which is intended to be limited solely by the appended claims.

What is claimed is:

1. A circuit for generating a trigger blanking voltage useful in the analysis of the ignition voltage waveform of an internal combustion engine comprising:

a. a monostable multivibrator having an input adapted to be coupled to the trigger voltage associated with the ignition voltage waveform, the output of said monostable providing said trigger blanking voltage, said monostable including an RC circuit which controls the duration of its unstable state;

b. capacitor circuit means coupled to the output of said monostable and providing an output coupled to the said RC circuit to thereby control the duration of the unstable state of said monostable comprising:

1. a switching transistor having its base coupled to the output of said monostable;
2. a first resistor in series with the collector-emitter path of said transistor said series combination including said resistor and said collector-emitter path coupled across a voltage; and a capacitor having one terminal coupled to one side of the collector-emitter path of said transistor;
3. a first diode and second resistor in parallel coupling the other side of said collector-emitter path to the other terminal of said capacitor; and c. means for generating a threshold voltage, said means coupled to said RC circuit through means isolating it from said capacitor circuit means.

2. A circuit according to claim 1 and further including a Zener diode coupled in parallel to said capacitor.

3. A circuit according to claim 1 wherein said RC circuit is coupled to said capacitor through a second diode.

* * * * *